US012696547B2

(12) United States Patent　　　　　(10) Patent No.:　US 12,696,547 B2
Imasaka et al.　　　　　　　　　　　(45) Date of Patent:　Jul. 28, 2026

(54) TRANSFORMER DEVICE AND SEMICONDUCTOR DEVICE

(71) Applicant: Mitsubishi Electric Corporation, Tokyo (JP)

(72) Inventors: Toshihiro Imasaka, Tokyo (JP); Yasuo Yamaguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 344 days.

(21) Appl. No.: 18/344,564

(22) Filed: Jun. 29, 2023

(65) Prior Publication Data

US 2024/0194662 A1　　Jun. 13, 2024

(30) Foreign Application Priority Data

Dec. 8, 2022　(JP) ................................. 2022-196599

(51) Int. Cl.
| *H10D 86/85* | (2025.01) |
| *H10D 84/40* | (2025.01) |
| *H10W 90/00* | (2026.01) |
| *H10W 72/00* | (2026.01) |
| *H10W 72/50* | (2026.01) |
| *H10W 72/90* | (2026.01) |

(52) U.S. Cl.
CPC ............. *H10D 86/85* (2025.01); *H10D 84/40* (2025.01); *H10W 90/00* (2026.01); *H10W 72/07554* (2026.01); *H10W 72/547* (2026.01); *H10W 72/944* (2026.01); *H10W 90/753* (2026.01)

(58) Field of Classification Search
CPC ........ H10D 86/85; H10D 84/40; H01L 25/18; H01L 24/06; H01L 24/48; H01L 24/49; H01L 2224/06102; H01L 2224/48091; H01L 2224/48105; H01L 2224/48137; H01L 2224/49107; H01L 23/645; H01F 27/323; H01F 17/0013; H01F 2017/0086; H01F 2027/2819
See application file for complete search history.

(56) References Cited

U.S. PATENT DOCUMENTS

2009/0046489 A1　2/2009　Yoshimura et al.
2020/0203058 A1*　6/2020　Osada .................. H01L 23/5227

FOREIGN PATENT DOCUMENTS

| JP | 2008-270490 A | 11/2008 |
| JP | 2014-022600 A | 2/2014 |
| JP | 2017-118128 A | 6/2017 |

OTHER PUBLICATIONS

"Examination Certificate" Office Action issued in DE 10 2023 121 678.3 by the German Patent and Trade Mark Office on Oct. 31, 2025.

* cited by examiner

*Primary Examiner* — Samuel A Gebremariam
(74) *Attorney, Agent, or Firm* — Studebaker Brackett PLLC

(57) ABSTRACT

According to the present disclosure, a transformer device comprises a first coil; a conductor provided outside the first coil in plan view and having a reference potential equal to a reference potential of the first coil; a first insulating layer provided above the first coil; a second coil provided on an upper surface of the first insulating layer; a second insulating layer provided between the second coil and the conductor so that a gap occurs between the second insulating layer and the first insulating layer; and a third insulating layer covering the first insulating layer, the second insulating layer, the second coil and the conductor.

14 Claims, 5 Drawing Sheets

110

120

14   29   8   13   9   10   25   26   27   12   11

1   2   4   5   6   3   7

130

14   29a   8   13   9   10   25   26   27   12   11

1   2   4   5   6   3   7

140

14    29b    8    13    9    10    25    26    27    12    11

1    2    4    5    6    3    7

150

14    29    8    13    9    10    25    26a    27    12    11

1    2    4    5    6    3    7

TRANSFORMER DEVICE AND SEMICONDUCTOR DEVICE

BACKGROUND OF THE INVENTION

Field

The present disclosure relates to a transformer device and a semiconductor device.

Background

JP 2008-270490 A discloses a technique of forming a coreless transformer on a semiconductor substrate as means for transmitting signals between two circuits that operate at different reference potentials. This coreless transformer is formed with coils respectively electrically connected to the two circuits.

However, with the above-described method, two coils have different reference potentials, and thus, when a potential difference occurs, there is a possibility of occurrence of discharging to an unintended portion from the coils. To prevent this discharging, it is necessary to secure a creeping distance. However, to secure the creeping distance, it is necessary to increase a chip size, which leads to a problem of increase in cost.

SUMMARY

In view of the above-described problems, an object of the present disclosure is to provide a transformer device and a semiconductor device that can achieve increase in a creeping distance without increasing a chip size.

The features and advantages of the present disclosure may be summarized as follows.

A transformer device according to the present disclosure includes: a first coil; a conductor provided outside the first coil in plan view and having a reference potential equal to a reference potential of the first coil; a first insulating layer provided above the first coil; a second coil provided on an upper surface of the first insulating layer; a second insulating layer provided between the second coil and the conductor so that a gap occurs between the second insulating layer and the first insulating layer; and a third insulating layer covering the first insulating layer, the second insulating layer, the second coil and the conductor.

Other and further objects, features and advantages of the disclosure will appear more fully from the following description.

DESCRIPTION OF EMBODIMENTS

First Embodiment

Figure 1:
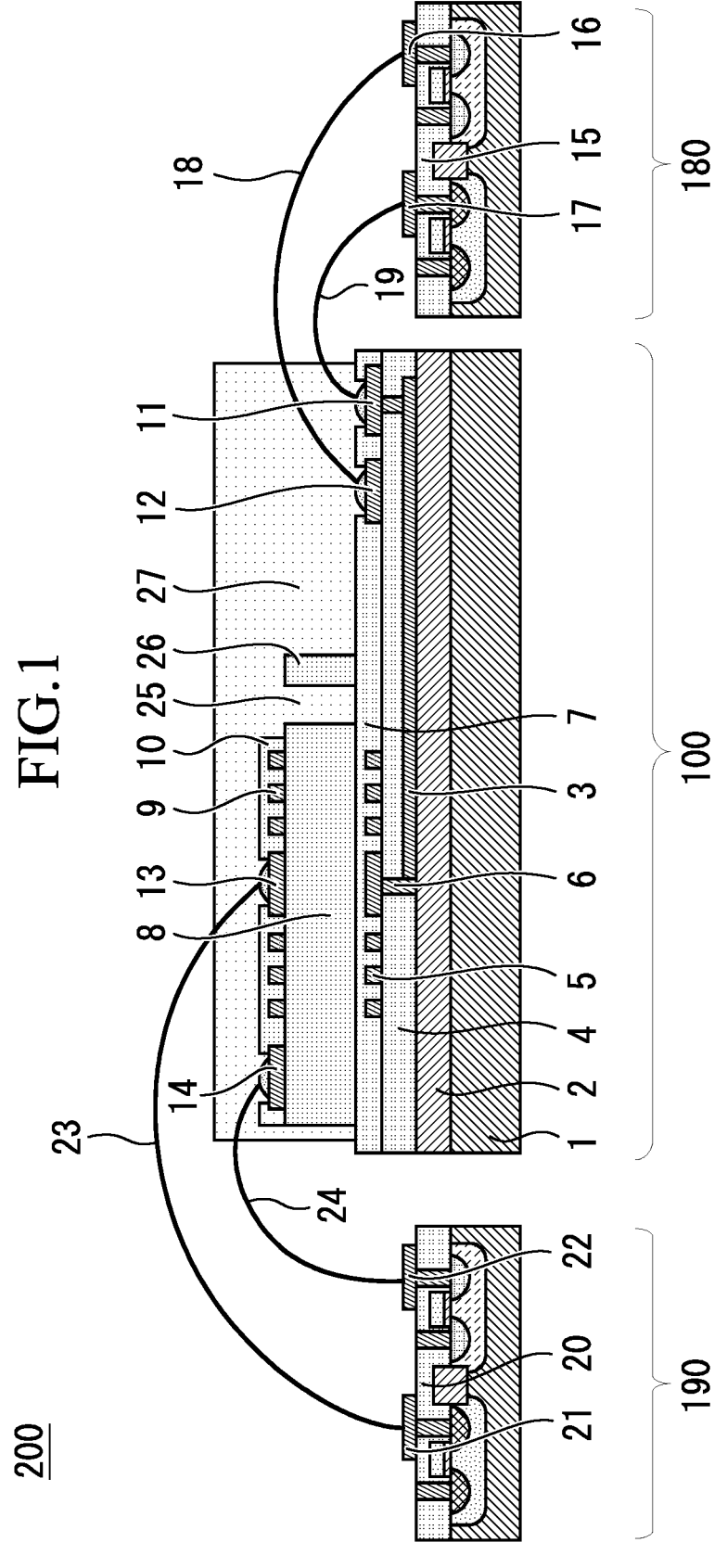
FIG. 1 is a cross-sectional view illustrating a configuration of a semiconductor device according to a first embodiment of the present disclosure.

FIG. 1 is a cross-sectional view illustrating a configuration of a semiconductor device according to a first embodiment of the present disclosure. A semiconductor device 200 includes a transformer device 100. The transformer device 100 includes a substrate 1. The substrate 1 may be a semiconductor substrate formed with a material such as silicon and a silicon compound or may be a substrate formed with an insulator such as glass, a wide band gap semiconductor such as SiC, GaN and diamond, or silicon on insulator (SOI).

An insulating layer 2 is formed on an upper surface of the substrate 1. The insulating layer 2 may be formed as a thermally oxidized film or may be formed through application, or the like, of TEOS or SiO2 in a case where the substrate 1 is a semiconductor substrate.

A wiring layer 3 is formed on an upper surface of the insulating layer 2. The wiring layer 3 is a part of a path that connects a wiring layer 9 which will be described later and a circuit region 15 which will be described later. The film of the wiring layer 3 is typically formed through sputtering, or the like, using Al or a compound including Al as a material, and a pattern is formed through wet etching or dry etching. However, the film of the wiring layer 3 may be formed using a method such as plating and vapor deposition instead of sputtering. Further, the wiring layer 3 may be formed with a metal such as Cu or may be formed with other conductors.

An insulating layer 4 is formed on an upper surface of the wiring layer 3. The insulating layer 4 is typically formed through application, or the like, of TEOS or SiO2, but may be formed using other insulating materials.

A wiring layer 5 is formed on an upper surface of the insulating layer 4. The wiring layer 5 is a first coil in a spiral shape having a pad 11 and a pad 12 as end portions. The pad 11 is connected to the wiring layer 5 through the wiring layer 3 and a via 6. Further, the wiring layer 5 forms a coreless transformer by magnetically coupling with the wiring layer 9 which will be described later.

Further, the film of the wiring layer 5 is typically formed through sputtering, or the like, using Al or a compound including Al as a material, and a pattern is formed through wet etching or dry etching. However, the film of the wiring layer 5 may be formed using a method such as plating and vapor deposition instead of sputtering. Further, the wiring layer 5 may be formed with a metal such as Cu or may be formed with other conductors.

An insulating layer 7 is formed on upper surfaces of the insulating layer 4 and the wiring layer 5. The insulating layer 4 is typically formed with SiN or polyimide but may be formed using other insulating materials.

An insulating layer 8 is formed on an upper surface of the insulating layer 7. As the insulating layer 8, an organic insulating layer such as polyimide may be used, or an insulating layer such as an oxide film may be used.

The wiring layer 9 is formed on an upper surface of the insulating layer 8. The wiring layer 9 is a second coil in a spiral shape having a pad 13 and a pad 14 as end portions. Further, the wiring layer 9 forms a coreless transformer by magnetically coupling with the wiring layer 5.

Further, the film of the wiring layer 9 is typically formed through sputtering, or the like, using Al or a compound including Al as a material, and a pattern is formed through wet etching or dry etching. However, the film of the wiring layer 9 may be formed using a method such as plating and vapor deposition instead of sputtering. Further, the wiring layer 9 may be formed with a metal such as Cu or may be formed with other conductors.

An insulating layer 10 is formed on upper surfaces of the insulating layer 8 and the wiring layer 9. Note that the insulating layer 10 may be formed on an upper surface of the insulating layer 7 except the pad 11, the pad 12, the pad 13 and the pad 14 or on an upper surface of a region 25.

The transformer device 100 includes an insulating layer 26. As the insulating layer 26, an organic insulating layer such as polyimide may be used, or an insulating layer such as an oxide film may be used. Further, a film thickness of the insulating layer 26 is preferably equal to or greater than a film thickness of the insulating layer 8. Note that the insulating layer 26 may be formed in such a form that the insulating layer 26 is separated from the insulating layer 8 by the region 25 which will be described later.

The region 25 exists between the insulating layer 26 and the insulating layer 8. Further, the region 25 is a region located outside the wiring layer 9 in the insulating layer 8 and penetrating to the insulating layer 7. For example, the region 25 separates the insulating layer 26 from the insulating layer 8 by being formed so as to enclose the wiring layer 9, the pad 13 and the pad 14. The region 25 may be formed through exposure or development of polyimide or may be formed through etching.

Note that a plurality of the regions 25 may be provided. Further, the region 25 may be formed only in a part of the transformer device 100, a semiconductor device region 180 and a semiconductor device region 190 which will be described later.

The region 25 is covered with an insulating layer 27 in a similar manner to the upper surfaces of the insulating layer 7, the insulating layer 10 and the insulating layer 26. The insulating layer 27 may be formed through resin sealing or gel sealing or may be formed with an insulating layer such as polyimide and an oxide film formed through a semiconductor process.

The semiconductor device 200 includes the semiconductor device region 180. While the semiconductor device region 180 is illustrated as a different chip here, the semiconductor device region 180 may be formed within the same chip. In this case, each connection may be made through a wiring layer instead of a wire bond.

The semiconductor device region 180 includes a circuit region 15. The circuit region 15 is a circuit region that causes the wiring layer 5 to operate. The circuit region 15 is connected to a wire bond 18 via a pad 16. The wire bond 18 is connected to the pad 12. Further, the circuit region 15 is connected to a wire bond 19 via a pad 17. The wire bond 19 is connected to the pad 11.

Further, the semiconductor device 200 includes the semiconductor device region 190. While the semiconductor device region 190 is illustrated as a different chip here, the semiconductor device region 190 may be formed within the same chip. In this case, each connection is made with a wiring layer instead of a wire bond.

The semiconductor device region 190 includes a circuit region 20. The circuit region 20 is a circuit region that causes the wiring layer 9 to operate. The circuit region 20 is connected to a wire bond 23 via a pad 21. The wire bond 23 is connected to the pad 13. Further, the circuit region 20 is connected to a wire bond 24 via a pad 22. The wire bond 24 is connected to the pad 14.

Figure 2:
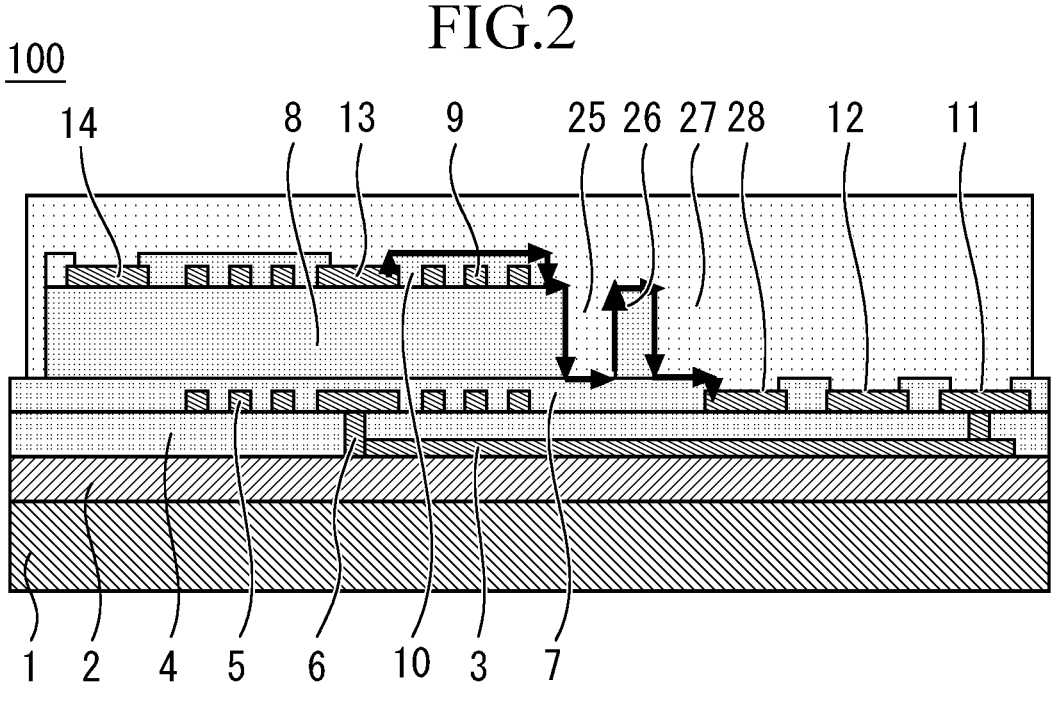
FIG. 2 is a cross-sectional view illustrating a creeping distance of the transformer device according to the first embodiment of the present disclosure.

FIG. 2 is a cross-sectional view illustrating a creeping distance of the transformer device according to the first embodiment of the present disclosure. A black arrow in FIG. 2 indicates a creeping distance from the wiring layer 9 to the wiring layer 5. The creeping distance refers to the shortest distance in a case where electricity flows along a surface of an insulator between conductors. In a case where an insulator exists between conductors, a short circuit does not occur in the insulator. Thus, a short circuit occurring between the conductors is caused by electricity flowing along a surface of an insulating layer between the conductors. In other words, short circuit between conductors can be prevented by sufficiently securing the creeping distance.

The creeping distance from the wiring layer 9 to the wiring layer 5 described here is a distance of a path along a surface of the insulating layer from the pad 13 that is an end portion of the wiring layer 9 to the pad 28. Note that the pad 28 is an arbitrary pad connected to the wiring layer 5.

Further, as a discharge path, a conductor having a reference potential equal to a reference potential of a coil, such as a pad and a wiring formed in the wiring layer 3 or the wiring layer 5, a wire connected to the pad, and a substrate on which the transformer device of the present disclosure is mounted, is assumed.

It is assumed here that a reference potential of the circuit region 15 is a first reference potential, and a reference potential of the circuit region 20 is a second reference potential. The circuit region 15 is a circuit region that causes the wiring layer 5 to operate. Thus, the reference potential of the wiring layer 5 becomes the first reference potential. In a similar manner, the circuit region 20 is a circuit region that causes the wiring layer 9 to operate. Thus, the reference potential of the wiring layer 9 becomes the second reference potential.

In a transformer device in related art, the region 25 is not provided. Thus, in a case where the second reference potential is higher than the first reference potential, it is necessary to secure a creeping distance from the wiring layer 9 to the wiring layer 5 for the purpose of insulating the wiring layer 9 from the pad 28. This, for example, requires increase in a chip size, which leads to a problem of increase in cost.

However, by forming the region 25 in the transformer device 100, a creeping distance from the wiring layer 9 to the wiring layer 5 can be increased. In other words, even in a case where the second reference potential is higher than the first reference potential, it is not necessary to increase a region for insulating the wiring layer 9 from the pad 28. By this means, it is possible to increase a creeping distance without suppressing increase in a chip size.

Note that FIG. 2 illustrates an example where a film thickness of the insulating layer 26 is equal to a film thickness of the insulating layer 8. On the other hand, in a case where the film thickness of the insulating layer 26 is greater than the film thickness of the insulating layer 8, that is, in a case where the upper surface of the insulating layer 26 is located higher than the upper surface of the insulating layer 8, the above-described creeping distance further increases. Thus, the film thickness of the insulating layer 26 is preferably equal to or greater than the film thickness of the insulating layer 8.

Figure 3:
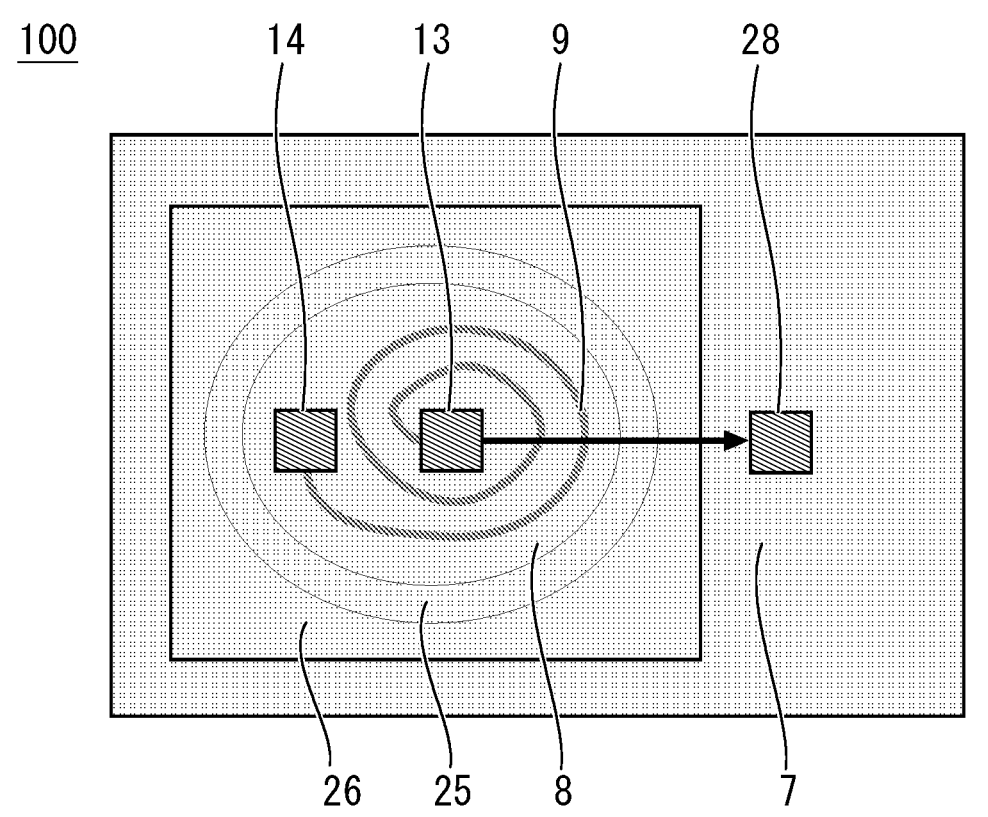
FIG. 3 is a plan view illustrating a creeping distance of the transformer device according to the first embodiment of the present disclosure.

FIG. 3 is a plan view illustrating a creeping distance of the transformer device according to the first embodiment of the present disclosure. Note that FIG. 3 illustrates a plan view of a part of the transformer device 100 to facilitate understanding of the creeping distance. Thus, FIG. 3 only illustrates a part of members except the insulating layer 27, and the like, that cover the whole.

As described above, the creeping distance indicates the shortest distance in a case where electricity flows along a surface of the insulator between conductors. Thus, the creeping distance illustrated in FIG. 2 becomes equal to a shortest path between the wiring layer 9 and the pad 28 in a case of FIG. 3.

Note that insulating capability of the transformer device 100 of the present embodiment may be increased by sealing the upper surface with a resin, or the like.

Further, while in the transformer device 100 of the present embodiment, a coil is formed with the wiring layer 3, the wiring layer 5 and the wiring layer 9, other wiring layers may be formed on or under these layers. Further, the wiring layer 3 may be omitted by use of a diffusion layer formed within a substrate through a semiconductor process.

Still further, a coil formed with the wiring layer 5 and the wiring layer 9 may be changed to a flat plate. This can also provide similar effects as an element that transmits a signal to capacitive coupling.

Second Embodiment

Figure 4:
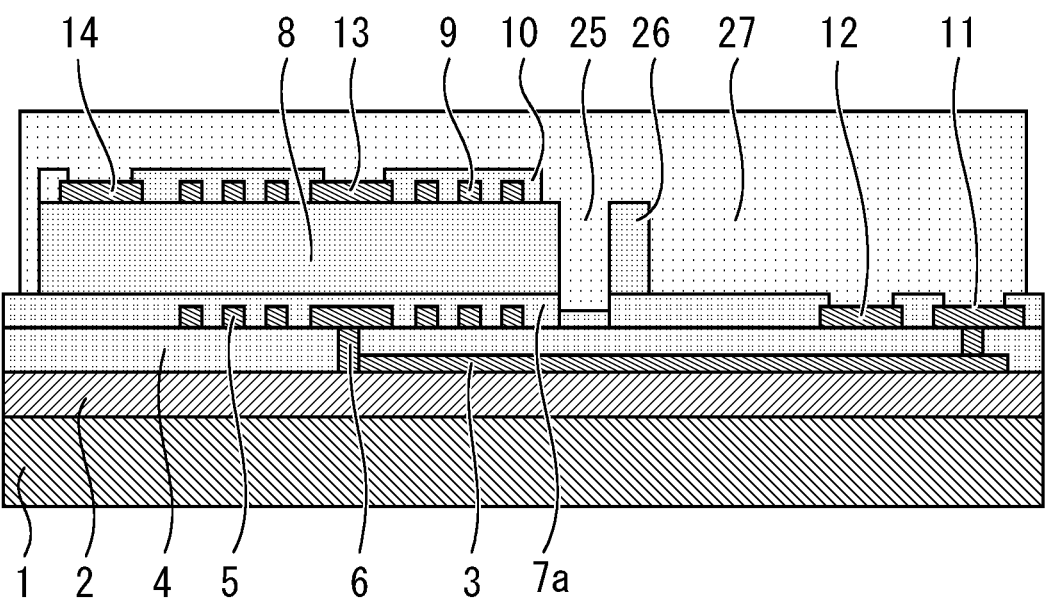
FIG. 4 is a cross-sectional view illustrating a transformer device according to a second embodiment of the present disclosure.

FIG. 4 is a cross-sectional view illustrating a transformer device according to a second embodiment of the present disclosure. A transformer device 110 of the present embodiment is different from that in the first embodiment in that the insulating layer 7 has a region with a thin film thickness in a range in which the insulating layer 7 faces the region 25.

The transformer device 110 includes an insulating layer 7a. The insulating layer 7a is different from the insulating layer 7 in that a film thickness in a range in which the insulating layer 7 faces the region 25 is made thin.

In a case where the transformer device 110 includes the insulating layer 7a, a distance from the pad 13 that is an end portion of the wiring layer 9 to the pad 28 becomes longer than in a case where the insulating layer 7a does not exist. In other words, the creeping distance from the wiring layer 9 to an arbitrary portion that operates at the first reference potential increases by the insulating layer 7a compared to the transformer device 100. This results in providing an effect of achieving further reduction in a size of a region for insulating the wiring layer 9 from the arbitrary portion that operates at the first reference potential.

Third Embodiment

Figure 5:
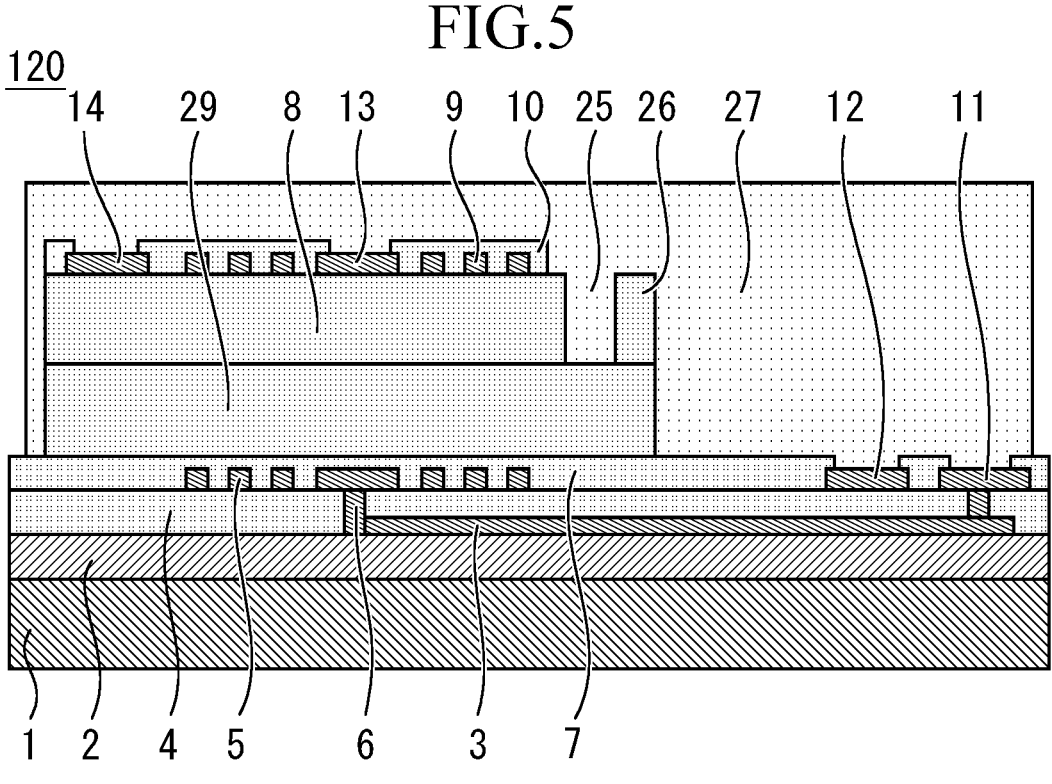
FIG. 5 is a cross-sectional view illustrating a transformer device according to a third embodiment of the present disclosure.

FIG. 5 is a cross-sectional view illustrating a transformer device according to a third embodiment of the present disclosure. A transformer device 120 of the present embodiment is different from that in the first embodiment in that an insulating layer 29 is formed between the insulating layer 7 and the insulating layer 8.

The transformer device 120 includes the insulating layer 29. The insulating layer 29 is formed on a surface which is the upper surface of the insulating layer 7 and an undersurface of the insulating layer 8. For example, while a thicker insulating layer is required to secure insulating capability required between the wiring layer 5 and the wiring layer 9, there is a case where there is a limitation in a film thickness of an insulating layer that can be formed in one process. In this case, by forming the insulating layer 29 in addition to the insulating layer 8, it is possible to sufficiently secure a film thickness of the whole insulating layer.

In a case where the transformer device 120 includes the insulating layer 29, a distance from the pad 13 that is an end portion of the wiring layer 9 to the pad 28 can be made longer than in a case where the insulating layer 29 does not exist. In other words, a creeping distance from the wiring layer 9 to an arbitrary portion that operates at the first reference potential increases by the insulating layer 29 compared to the transformer device 100. This results in providing an effect of achieving further reduction in a size of a region for insulating the wiring layer 9 from the arbitrary portion that operates at the first reference potential.

Fourth Embodiment

Figure 6:
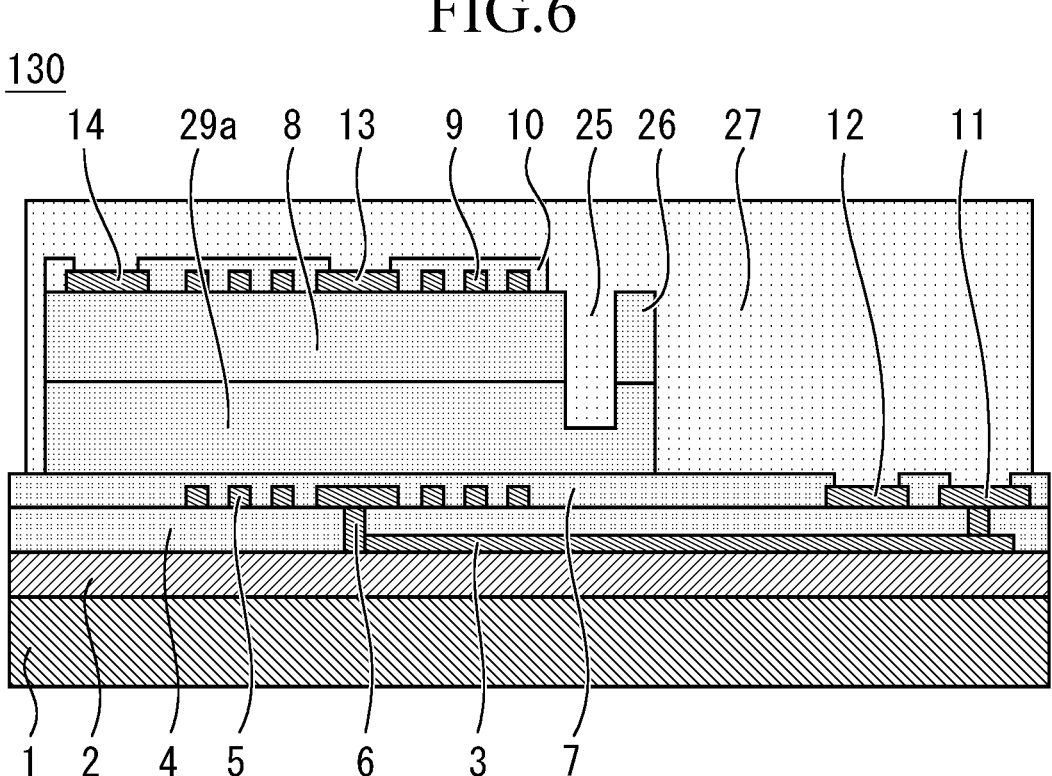
FIG. 6 is a cross-sectional view illustrating a transformer device according to a fourth embodiment of the present disclosure.

FIG. 6 is a cross-sectional view illustrating a transformer device according to a fourth embodiment of the present disclosure. A transformer device 130 of the present embodiment is different from that in the third embodiment in that the insulating layer 29 has a region with a thin film thickness in a range in which the insulating layer 29 faces the region 25.

The transformer device 130 includes an insulating layer 29a. The insulating layer 29a is different from the insulating layer 29 in that a film thickness in a range in which the insulating layer 29 faces the region 25 is made thin. The region with a thin film thickness may be formed through etching or may be formed through solarization.

In a case where the transformer device 130 includes the insulating layer 29a, a distance from the pad 13 that is an end portion of the wiring layer 9 to the pad 28 becomes longer than in a case where the insulating layer 29 exists. In other words, a creeping distance from the wiring layer 9 to an arbitrary portion that operates at the first reference potential increases by the insulating layer 29a compared to the transformer device 120. This results in providing an effect of achieving further reduction in a size of a region for insulating the wiring layer 9 from the arbitrary portion that operates at the first reference potential.

Fifth Embodiment

Figure 7:
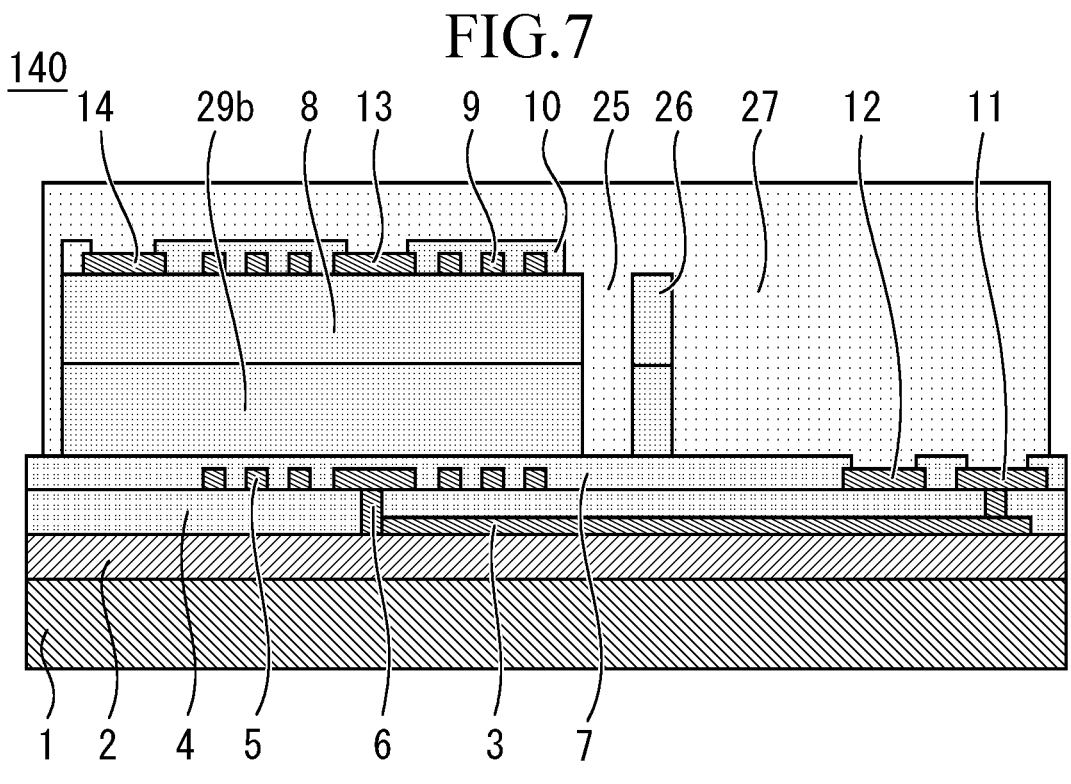
FIG. 7 is a cross-sectional view illustrating a transformer device according to a fifth embodiment of the present disclosure.

FIG. 7 is a cross-sectional view illustrating a transformer device according to a fifth embodiment of the present disclosure. A transformer device 140 of the present embodiment is different from that in the third embodiment in that the insulating layer 29 has a penetrating region in a range in which the insulating layer 29 faces the region 25.

The transformer device 140 includes an insulating layer 29b. The insulating layer 29b is different from the insulating layer 29 in that the insulating layer 29b has a penetrating region in a range in which the insulating layer 29 faces the region 25. The penetrating region may be formed through etching or may be formed through solarization.

In a case where the transformer device 140 includes the insulating layer 29b, a distance from the pad 13 that is an end portion of the wiring layer 9 to the pad 28 becomes longer than in a case where the insulating layer 29a exists. In other words, a creeping distance from the wiring layer 9 to an arbitrary portion that operates at the first reference potential increases by the insulating layer 29b compared to the transformer device 130. This results in providing an effect of achieving further reduction in a size of a region for insulating the wiring layer 9 from the arbitrary portion that operates at the first reference potential.

Sixth Embodiment

Figure 8:
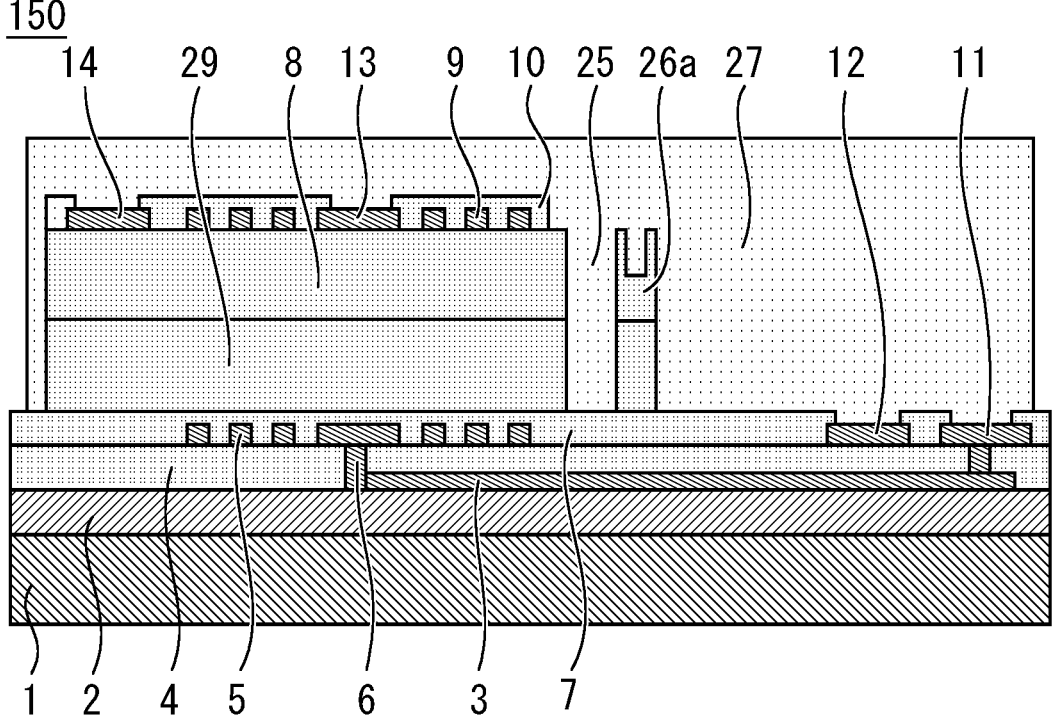
FIG. 8 is a cross-sectional view illustrating a transformer device according to a sixth embodiment of the present disclosure.

FIG. 8 is a cross-sectional view illustrating a transformer device according to a sixth embodiment of the present disclosure. A transformer device 150 of the present embodiment is different from that in the fifth embodiment in that the insulating layer 26 has a recess on an upper surface.

The transformer device 150 includes an insulating layer 26a. The insulating layer 26a is different from the insulating layer 26 in that the insulating layer 26a has a recess on an upper surface. The recess may be formed through etching or may be formed through solarization.

In a case where the transformer device 150 includes the insulating layer 26a, a distance from the pad 13 that is an end portion of the wiring layer 9 to the pad 28 becomes longer than in a case where the insulating layer 29a exists. In other words, a creeping distance from the wiring layer 9 to an arbitrary portion that operates at the first reference potential increases by the insulating layer 29b compared to the transformer device 140. This results in providing an effect of achieving further reduction in a size of a region for insulating the wiring layer 9 from the arbitrary portion that operates at the first reference potential.

Note that each embodiment described in the present disclosure is an example, and modifications, omission or combination can be made as appropriate. Further, expression of "on" and "under" in the present disclosure are used assuming that one direction of the transformer device or the semiconductor device is an upward direction, and an opposite direction thereof is a downward direction. In other words, the expression does not limit an upward direction and a downward direction upon manufacturing or use of the transformer device or the semiconductor device.

Obviously many modifications and variations of the present disclosure are possible in the light of the above teachings. It is therefore to be understood that within the scope of the appended claims the disclosure may be practiced otherwise than as specifically described.

The entire disclosure of a Japanese Patent Application No. 2022-196599, filed on Dec. 8, 2022 including specification, claims, drawings and summary, on which the Convention priority of the present application is based, are incorporated herein by reference in its entirety.

The invention claimed is:

1. A transformer device comprising:
a first coil;
a conductor provided outside the first coil in plan view and having a reference potential equal to a reference potential of the first coil;
a first insulating layer provided above the first coil;
a second coil provided on an upper surface of the first insulating layer;
a second insulating layer provided between the second coil and the conductor so that a gap occurs between the second insulating layer and the first insulating layer; and
a third insulating layer covering the first insulating layer, the second insulating layer, the second coil and the conductor, wherein the third insulating layer separates the second insulating layer and the first insulating layer in a radial direction of the second coil in plan view.

2. The transformer device according to claim 1, wherein an upper surface of the second insulating layer is located higher than the upper surface of the first insulating layer.

3. The transformer device according to claim 1, further comprising:
a fourth insulating layer provided on an upper surface of the first coil,
wherein the fourth insulating layer has a region with a thin film thickness in a range in which the fourth insulating layer faces the gap.

4. The transformer device according to claim 1, comprising:
a fifth insulating layer between the first coil and the first insulating layer.

5. The transformer device according to claim 4, wherein the fifth insulating layer has a region with a thin film thickness in a range in which the fifth insulating layer faces the gap.

6. The transformer device according to claim 4, wherein the fifth insulating layer has a recessed region filled with the third insulating layer in a range in which the fifth insulating layer faces the gap.

7. The transformer device according to claim 1, wherein the second insulating layer has a recess filled with the third insulating layer on an upper surface.

8. The transformer device according to claim 1, wherein the first insulating layer and the second insulating layer are organic insulating layers.

9. The transformer device according to claim 1, wherein the first coil and the second coil are formed with flat plates.

10. The transformer device according to claim 1, wherein the transformer device is formed with a wide band gap semiconductor.

11. The transformer device according to claim 10, wherein the wide band gap semiconductor is silicon carbide, a gallium nitride material or diamond.

12. A semiconductor device comprising:
the transformer device according to claim 1;
a first semiconductor circuit electrically connected to the first coil; and
a second semiconductor circuit electrically connected to the second coil.

13. The semiconductor device according to claim 12, wherein the transformer device, the first semiconductor circuit and the second semiconductor circuit are formed on the same chip.

14. A transformer device comprising:
a first coil;
a conductor provided outside the first coil in plan view and having a reference potential equal to a reference potential of the first coil;
a first insulating layer provided above the first coil;
a second coil provided on an upper surface of the first insulating layer;
a second insulating layer provided between the second coil and the conductor so that a gap occurs between the second insulating layer and the first insulating layer; and
a third insulating layer covering the first insulating layer, the second insulating layer, the second coil and the conductor, wherein the third insulating layer circumferentially separates the second insulating layer and the first insulating layer in a radial direction of the second coil in plan view.

* * * * *